United States Patent [19]
Johnson

[11] Patent Number: 6,081,162
[45] Date of Patent: Jun. 27, 2000

[54] ROBUST METHOD AND APPARATUS FOR PROVIDING A DIGITAL SINGLE-ENDED OUTPUT FROM A DIFFERENTIAL INPUT

[75] Inventor: Luke A. Johnson, Tempe, Ariz.

[73] Assignee: Intel Corporation, Santa Clara, Calif.

[21] Appl. No.: 09/336,367

[22] Filed: Jun. 17, 1999

[51] Int. Cl.[7] .............................. H03F 3/04; H03F 3/45; H03K 5/22
[52] U.S. Cl. .......................... 330/301; 330/258; 327/65
[58] Field of Search .................................. 330/253, 258, 330/301, 307, 66; 327/50, 65

[56] References Cited

U.S. PATENT DOCUMENTS

| | | | |
|---|---|---|---|
| 4,353,059 | 10/1982 | Vaitkus | 340/347 AD |
| 5,047,665 | 9/1991 | Burt | 330/253 |
| 5,374,859 | 12/1994 | Doyle et al. | 327/65 |
| 5,990,743 | 11/1999 | Gabara | 330/258 |

*Primary Examiner*—Robert Pascal
*Assistant Examiner*—Patricia T. Nguyen
*Attorney, Agent, or Firm*—Blakely, Sokoloff, Taylor & Zafman LLP

[57] ABSTRACT

An embodiment of the invention is directed to a method of automatically adjusting a common mode output level of a first differential amplifier that is connected to a first digital circuit, in response to variation in a trip point level of a second digital circuit. The second digital circuit includes a replicate of the first digital circuit to generate a trip point level that is equivalent to a trip point level of the first digital circuit. The invention may yield a single-ended digital signal whose duty cycle accurately tracks that of an input differential signal pair in a manner that is substantially independent of fabrication process skew.

18 Claims, 5 Drawing Sheets

DIFFERENTIAL TO SINGLE ENDED CIRCUIT

US 6,081,162

ROBUST METHOD AND APPARATUS FOR PROVIDING A DIGITAL SINGLE-ENDED OUTPUT FROM A DIFFERENTIAL INPUT

FIELD OF THE INVENTION

This invention is related to techniques for providing a digital single-ended output signal from a differential signal pair.

BACKGROUND

Electronic systems often use a differential signal pair to transport signals accurately across a printed wiring board or an electronic bus. The use of a differential signal permits the easy removal of noise that may have been added while the signal made its way through a busy wiring board or bus. Once the differential signal has arrived at its destination, a single-ended signal will need to be derived from it, because most electronic functions are implemented using signals that are referenced to a common ground.

FIG. 5 shows a conventional differential to single-ended (DS) circuit 504, that translates a differential signal pair into a single-ended output. In digital electronic systems, the single-ended signal digital should ideally have the same duty cycle as the differential signal pair. The duty cycle requirement means that the time interval Tdiff between any two consecutive crossings of the differential signal pair, is equal to a corresponding time interval Tsingle between two consecutive transitions of the single-ended signal.

Unfortunately, the ideal differential to single-ended translation described above cannot be achieved in practice. Non-idealities in manufactured circuits, and the sensitivity of such circuits to temperature and power supply variations, prevent the single-ended signal from having the exact duty cycle as the differential signal pair. As a result, the single-ended signal obtained by conventional DS circuits is skewed when compared to the differential signal pair.

A limited solution to the skew problem has been to better control the manufacturing process to yield DS circuits that are structurally more consistent. Despite such attempts, most digital circuit designers take the conservative approach and will design their digital circuitry to tolerate a certain amount of skew in the single-ended signals that are derived from a differential signal pair. This may be a proper precaution because even if the manufacturing process could be accurately controlled, it still does not eliminate the skew caused by the sensitivity of the conventional DS circuit 504 to power supply or temperature variations. Therefore, there is a need to minimize the skew resulting from a conventional DS circuit.

SUMMARY

An embodiment of the invention is directed to a method of automatically adjusting a common mode output level of a first differential amplifier that is connected to a first digital circuit, in response to variation in a trip point level of a second digital circuit. The second digital circuit includes a replicate of the first digital circuit to generate a trip point level that is equivalent to a trip point level of the first digital circuit.

Other features and advantages of the invention will be apparent from the accompanying drawings and from the detailed description that follows below.

BRIEF DESCRIPTION OF THE DRAWINGS

The invention is illustrated by way of example and not by way of limitation in the figures of the accompanying drawings in which like references indicate similar elements and in which.

DETAILED DESCRIPTION

The invention helps minimize the skew in a single-ended signal derived from an input differential signal pair, by helping to ensure that the time interval between successive transitions of the output of a first digital circuit in a DS circuit closely tracks the time intervals between corresponding successive cross-overs of the differential pair. A further advantage may be obtained by using identical circuit layouts for the first and second digital circuits, which helps maintain even closer correspondence between the circuits' respective trip point levels.

Figure 1:
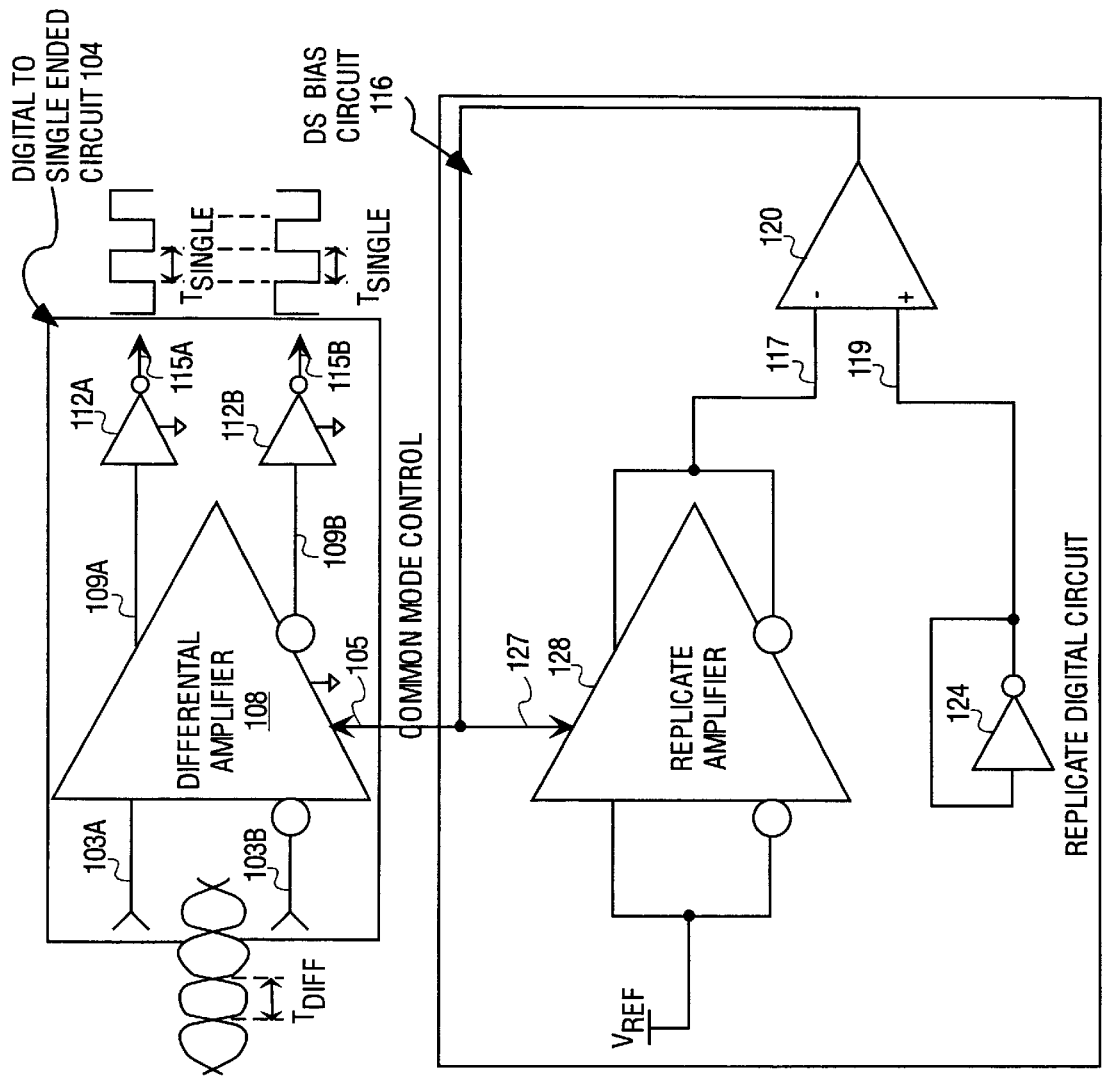
FIG. 1 shows a block diagram of an embodiment of the invention.

FIG. 1 shows a block diagram of an embodiment of the invention. A differential-to-single-ended (DS) circuit 104 includes a differential amplifier 108 having a pair of inputs 103a and 103b. These inputs receive a differential signal pair that have repeated cross-overs at an average or "common mode" value. The time interval between two consecutive cross-overs is Tdiff. The differential amplifier 108 also has a common mode output level adjustment input 105 that allows the output common mode level, i.e., the average value of the two signals generated at the complementary outputs 109a and 109b, to be adjusted up or down. Thus, the differential amplifier 108 may provide both amplitude gain and dc offset to the input differential signal pair.

The differential amplifier 108 has two complementary outputs 109a and 109b each feeding the input of a respective digital circuit 112a and 112b. The digital circuit 112 is a circuit that has only two stable states. It may include, for instance, a logic inverter as shown in the embodiment of FIG. 1, although the invention is not limited in this aspect. Alternatives for the logic inverter include NAND gates, NOR gates, or combinations thereof. Another alternative is a comparator, such as one based on an operational amplifier that has one of its inputs set at a voltage or current that can be duplicated using a replicate or partial replicate circuit. Each digital circuit 112 generates a single ended digital signal that is referenced to a common ground and is derived from one of the outputs of the differential amplifier 108. In accordance with the proper operation of the invention, the digital output signals shown in FIG. 1 are expected to have virtually the same duty cycle as the input differential pair, i.e., Tsingle~Tdiff for all corresponding intervals.

Each digital circuit 112 has a trip point level which refers to a threshold range of input voltage or current to the circuit 112. An input signal larger than the trip point level will cause an output of the digital circuit to be driven to one extreme, whereas an input signal smaller than the trip point level will cause the output to be driven to the other extreme. As an example, the trip point level may be the gate-to-source threshold voltage of the n-channel metal oxide semiconductor (MOS) field effect transistor (FET) in a p-channel/n-channel MOS inverter. The trip point level in a manufactured circuit is subject to variation caused in part by changes in the ambient temperature at which the circuit is operating and perhaps by changes in the power supply. In addition, the trip point level may vary between otherwise identical circuits in the same manufactured lot or across different lots, due to variations in the fabrication process.

In a particular embodiment of the invention, the differential signal pair has a maximum peak to peak signal value that is a relatively small percentage of the full swing of the single-ended digital signal, the full swing being approximately the difference between common ground and a supply voltage applied to the digital circuit 112. However, the invention is not limited to such a relationship between the signals.

Continuing with FIG. 1, the DS circuit 104 is coupled to a DS bias circuit 116 which controls the common mode output level of the differential amplifier 108 in the DS circuit 104. A comparison amplifier 120 has a non-inverting signal input 119 coupled to a second digital circuit 124. The second digital circuit 124 includes a replicate of a portion of the first digital circuit 112 necessary to generate a trip point signal that is equivalent to a trip point of the first digital circuit 112. In other words, the second digital circuit 124 may be an entire or partial replicate of the first digital circuit 112, so long as an electrically equivalent trip point level is generated by the second circuit. In the particular embodiment of FIG. 1, an equivalent trip point signal is generated by shorting an output of the second digital circuit 124 to its input, although the invention is not limited to such a configuration for generating the trip point signal. An output of the comparison amplifier 120 is coupled to the common mode output level adjustment input 105 of the differential amplifier 108 in the DS circuit 104. The comparison amplifier 120 continuously adjusts the common mode output level of the differential amplifier 108 in response to the trip point signal from the second digital circuit 124.

The comparison amplifier 120 operates in a closed control loop to ensure that its inverting input 117 exactly tracks the trip point signal at its non-inverting input. In the embodiment shown in FIG. 1, the inverting input 117 receives a signal from a replicate amplifier 128 that includes a replicate of a portion of the differential amplifier 108. The signal generated by the replicate portion is equivalent to a common mode output level of the differential amplifier 108. Without limiting the invention, this signal may be generated by the configuration shown in FIG. 1 in which the replicate amplifier 128 is a complete differential amplifier with its inputs shorted and connected to a reference voltage Vref, and its outputs shorted to yield the common mode value. In this embodiment, the output of the comparison amplifier 120 controls both a common mode output level adjustment input 105 of the differential amplifier 108 and the common mode output level adjustment input 127 of the replicate amplifier 128 to close the control loop.

Assuming the common mode level of the replicate amplifier 128 duplicates and varies in the same way as the common mode level of the differential amplifier 108, and the trip point level of the second (replicate) digital circuit 124 duplicates and varies in the same way as the trip point level of the digital circuit 112, then the control loop maintains the common mode output level of the differential amplifier 108 at the same value as the trip point level of the digital circuit 112. Since the crossovers in the input differential signal pair are translated into cross-overs at the common mode level at the outputs 109a and 109b of the differential amplifier 108, the latter cross-overs will be adjusted up or down according to variations in the trip point level of the digital circuit 112. This adjustment ensures that the digital circuit 112 will transition consistently each time there is a cross-over in the input differential signal pair, regardless of any variations in its trip point level.

In another embodiment of the invention, the inverting input 117 of the comparison amplifier 120 receives a signal that represents the common mode level of the differential amplifier 108 itself rather than a replicate, such that the replicate amplifier 128 is eliminated. This embodiment, however, would need circuitry (not shown) that derives the operating common mode output level directly from the differential amplifier 108. Such circuitry can be readily developed by one of ordinary skill in the art and need not be illustrated here. Feeding the output of the comparison amplifier 120 to the common mode output level adjustment input 105 of the differential amplifier 108 closes the control loop in this embodiment.

Figure 2:
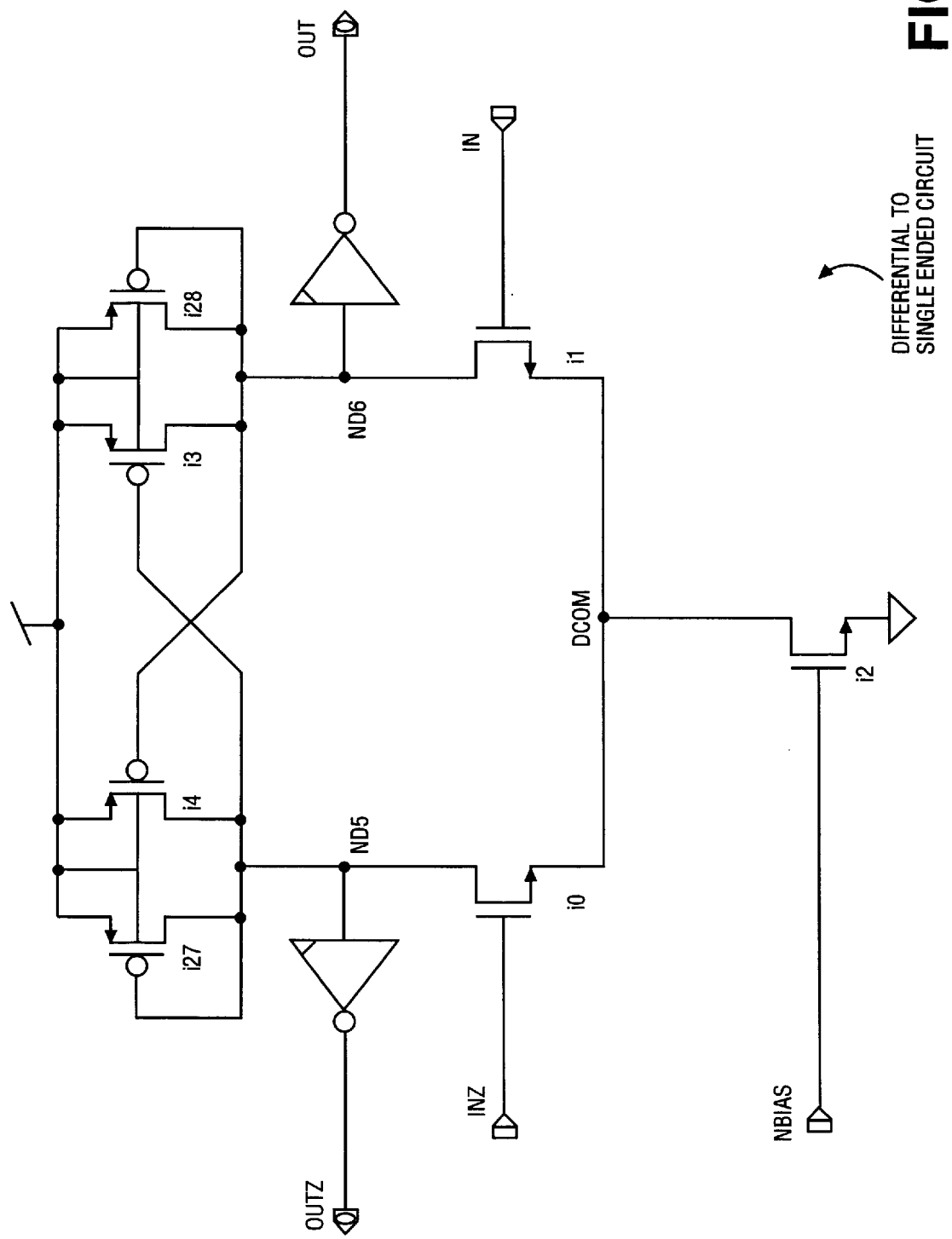
FIG. 2 illustrates a schematic of a differential to single-ended circuit.
Figure 3:
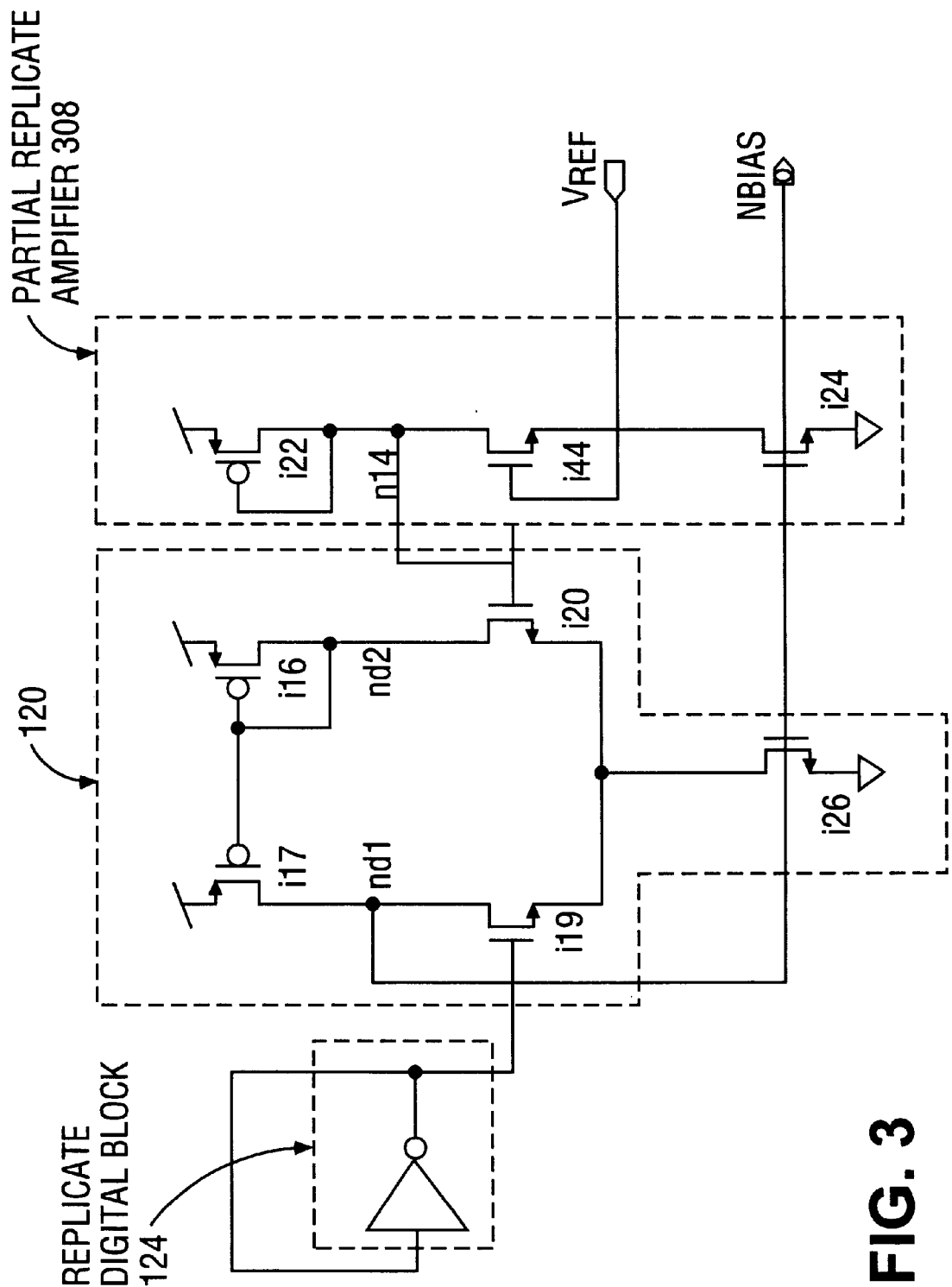
FIG. 3 shows a schematic of a differential to single-ended bias circuit according to an embodiment of the invention.

FIGS. 2 and 3 illustrate a specific implementation of the DS circuit 104 and the DS bias circuit 116 using MOS-based components. The DS circuit shown in FIG. 2 includes a differential amplifier formed by the combination of I0 and I1 being n-channel devices having their sources shorted at DCOM and connected to the drain of I2. I2 is actually made of four identical devices having a W/L ratio of 2.0/1.0. Each of the I0 and I1 devices are actually two identical devices having a W/L ratio of 3.0/0.4. The load to the differential amplifier includes the combination of four devices I27, I28, I3 and I4. I3 and I4 are cross-coupled in a latch-type configuration, and I27, I28 are diode connected p-channel devices. The outputs of the differential amplifier are at nodes ND5 and ND6, which are connected to respective inverters I25 and I10. These inverters correspond to the digital circuits 112a and 112b of FIG. 1. The inverters include a p-channel device with a W/L ratio of 4.0/1.0 and an n-channel device of dimensions 2.0/1.0. The digital single ended output are provided, in a complementary fashion, by these two inverter devices. The gate of I2 may be considered to be the common mode output level adjustment input of the differential amplifier in FIG. 2, because there appears to be a direct relationship between the voltage at the gate of I2 and the average voltage at nodes ND5 and ND6. Of course, the DS circuit shown in FIG. 2 and described above is merely exemplary and one of ordinary skill in the art can readily design a wide range of other circuit configurations that will yield a digital single ended output from an input differential signal pair.

FIG. 3 shows an exemplary DS bias circuit that generates an n-bias signal for controlling the common mode output level of the DS circuit in FIG. 2. The comparison amplifier 120 of FIG. 1 is formed by a conventional operational amplifier design having devices I19 and I20 connected to a bias device I26 at their source, and load devices I17 and I16 at their drains. The gate of input device I20 is shorted to node ND4 of a partial replicate amplifier 308. The other input at the gate of device I19 is shorted to the input and output of a logic inverter I11, which is part of the replicate digital circuit 124. In this embodiment, the inverter I11 is a complete replicate of either inverter I25 or I10 of the DS circuit in FIG. 2.

The design of the partial replicate amplifier 308 as shown in FIG. 3 is obtained by simply shorting nodes ND5 and ND6 of FIG. 2 and taking ¼ of the stack of devices being I2, I1, and I28. Note that these three devices should have the same orientation and layout as corresponding devices I22, I44, and I24 in the replicate amplifier 308. The partial replicate amplifier 308 is only ¼ of the differential amplifier in FIG. 2 but is necessary and sufficient to generate a voltage at ND4 (FIG. 3) that is equivalent to the common mode output level available at nodes ND5 and ND6 (FIG. 2). Thus, the comparison amplifier 120 shown in FIG. 3 compares a static voltage at ND3 (which is the trip point signal from the inverter I11) to the output of the partial replicate amplifier 308 at node ND4. An output of the comparison amplifier 120 is taken from node ND1 as the n-bias signal which controls both I24 in the partial replicate amplifier 308 and a corresponding device I2 in the differential amplifier in FIG. 2.

In the particular embodiment shown in FIG. 3, the gate of I44 in the partial replicate amplifier 308 receives a voltage Vref which may be the common mode voltage of the input differential signal pair supplied to the gates of I0 and I1 in FIG. 2. Alternatively, Vref may be eliminated and the gate of I44 be shorted to ND4. It appears that such a change would be permissible because the voltage at ND4 is made to be the same as the common mode voltage of the input differential signal pair. However, a start-up circuit may be needed in that case, because the power off condition may be a stable condition for the control loop that is defined in part by the partial replicate amplifier 308 having its input at the gate of I44 shorted to its output at ND4. In such a circumstance, the control loop may not change to the state in which the voltage at ND4 tracks the common mode level of the input differential signal pair to the DS circuit 104 in FIG. 2.

Figure 4:
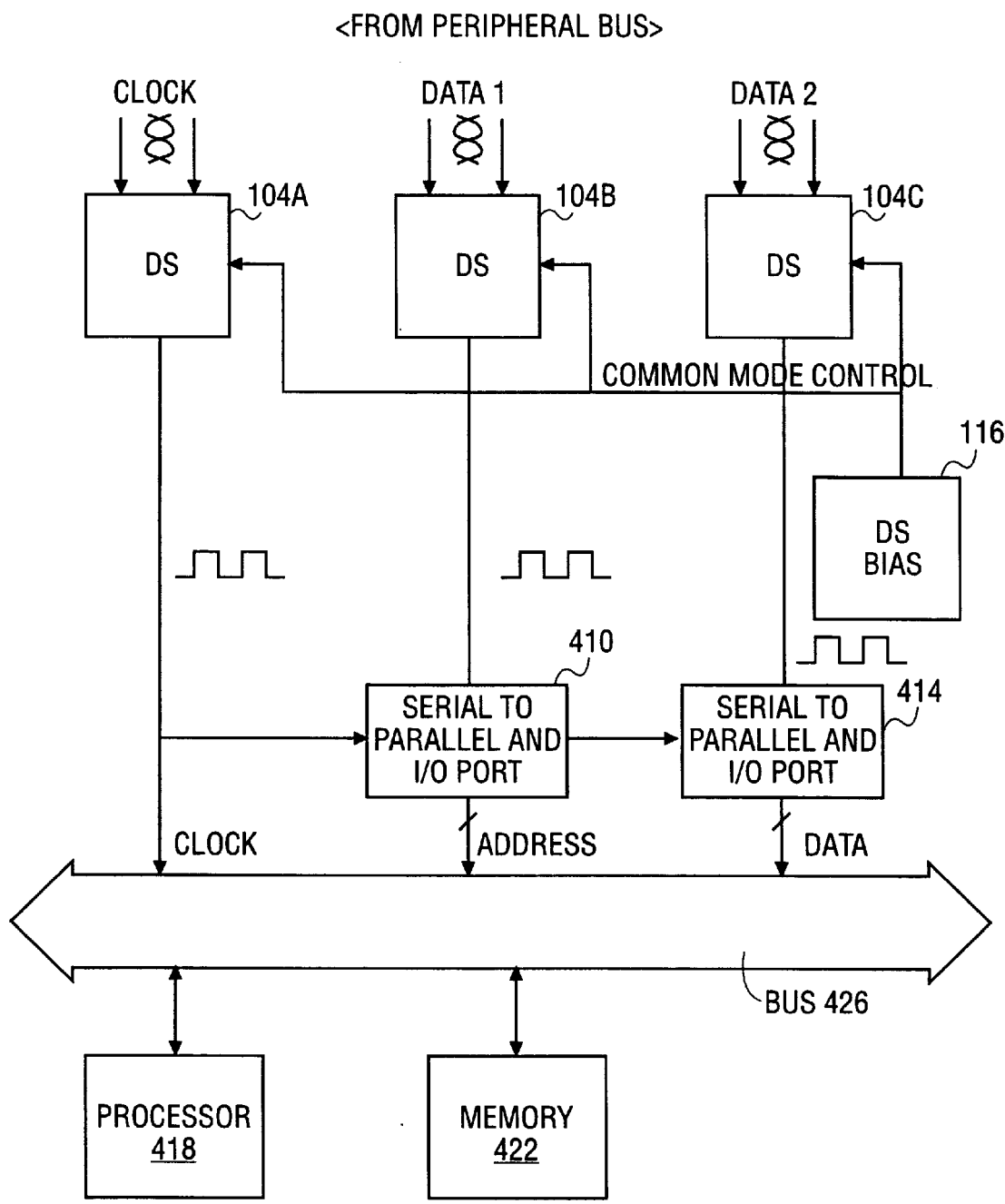
FIG. 4 illustrates a block diagram of an electronic system featuring a DS circuit and DS bias circuit according to an embodiment of the invention.
Figure 5:
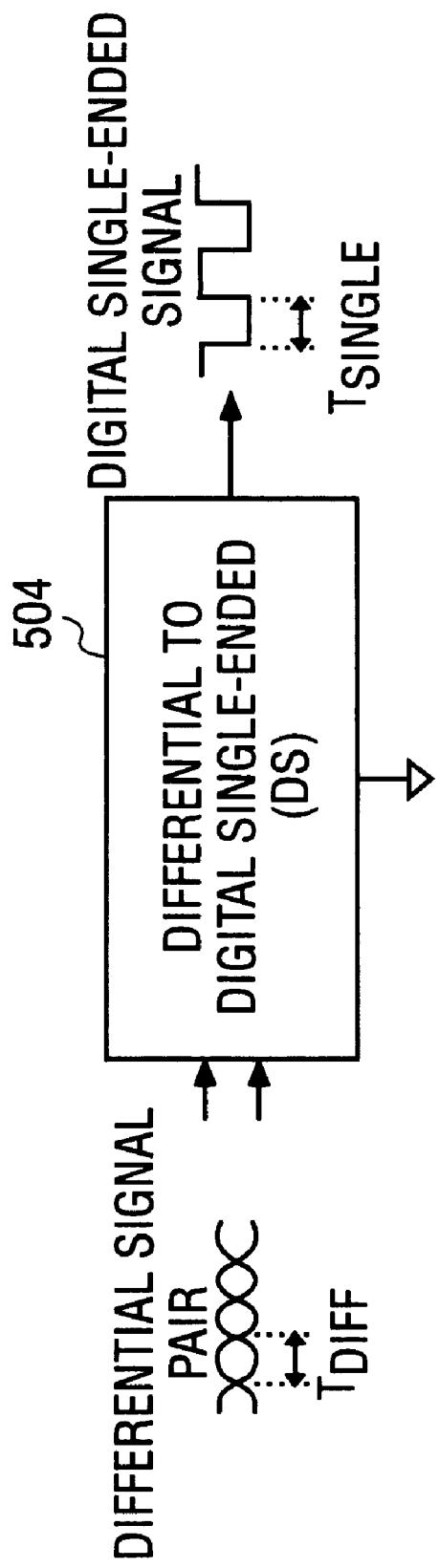
FIG. 5 shows a typical differential signal pair and a corresponding digital single-ended signal derived from it using a conventional differential to single-ended circuit.

Some of the applications of the DS circuit 104 and the DS bias circuit 116 described above, including the particular embodiments of FIGS. 1–3, include clock and data recovery circuits in digital systems. Such recovery circuits can be used at several locations of a large printed wiring board such as a personal computer (PC) motherboard that implements digital functions. Alternatively, they can be used to recover digital clock and data signals from an input differential signal pair received over a computer peripheral bus (e.g., a high speed serial bus), as illustrated in FIG. 4. In many cases, the system application will include digital circuitry such as a processor 418 and memory 422 that is clocked by the single-ended digital signal generated by the DS circuit 104. Serial to parallel converters 410 and 414 as part of I/O ports on the motherboard may be used to obtain data and address signals that are fed to a bus 426. In such applications, it is expected that the invention will provide a sufficiently skew-free clock that allows the digital circuitry to latch data on both a rising edge and a falling edge of the clock in an error-free manner. The differential input, and therefore the clock derived therefrom, may be running at exactly 50% duty cycle.

To summarize, various embodiments of the invention directed to a robust method and apparatus for providing a digital single-ended output from a differential input have been described. In the foregoing specification, the invention has been described with reference to specific exemplary embodiments thereof. It will, however, be evident that various modifications and changes may be made thereto without departing from the broader spirit and scope of the invention as set forth in the appended claims. For instance, when implementing the invention, the DS circuit, the digital circuitry, the replicate digital circuit, and the comparison amplifier may be parts of the same integrated circuit die. Alternatively, the digital circuitry may be on a separate die that is attached to the same printed wiring board as the die that contains the DS circuit, the replicate digital circuit, and the comparison amplifier. The specification and drawings are, accordingly, to be regarded in an illustrative rather that a restrictive sense.

What is claimed is:

1. A method comprising:
automatically adjusting a common mode output level of a first differential amplifier that is coupled to a first digital circuit, in response to variation in a trip point level of a second digital circuit, the second digital circuit includes a replicate of the first digital circuit to generate a trip point level that is equivalent to a trip point level of the first digital circuit.

2. The method of claim 1 further comprising:
applying a differential signal pair to an input of the differential amplifier and in response generating a single ended digital signal from the first digital circuit.

3. The method of claim 2 wherein the single ended digital signal has a full swing that is approximately a difference between common ground and a supply voltage, and the differential signal pair has a maximum value that is a relatively small percentage of the full swing.

4. The method of claim 1 wherein the variation in the trip point is caused in part by a change in ambient temperature.

5. The method of claim 1 wherein the variation in the trip point is caused in part by manufacturing variations between different lots containing copies of the first digital circuit.

6. A circuit comprising:
first differential amplifier having an output and a common mode output level adjustment input;
first digital circuit having an input coupled to the output of the first differential amplifier and an output that provides a single ended digital signal in response to an output signal of the differential amplifier;
second digital circuit that includes a replicate of a portion of the first circuit to generate a trip point signal that is equivalent to a trip point of the first digital circuit; and
comparison amplifier having an input coupled to the second digital circuit and an output coupled to the common mode level adjustment input of the first differential amplifier to adjust the common mode output level of the first differential amplifier in response to the trip point signal of the second digital circuit.

7. The circuit of claim 6 further comprising:
second amplifier that includes a replicate of a portion of the first differential amplifier to generate a signal that is equivalent to a common mode output level of the first differential amplifier, the second amplifier being coupled to an input of the comparison amplifier, wherein the comparison amplifier adjusts the common mode output level of the first amplifier in response to comparing the signal from the second amplifier to the trip point signal of the second digital circuit.

8. The circuit of claim 6 further comprising:
second amplifier that includes a replicate of a portion of the first differential amplifier, the comparison amplifier having a first input coupled to the second digital circuit, a second input coupled to an output of the second amplifier, the output of the comparison amplifier being further coupled to an output level adjustment input of the second amplifier to adjust the common mode output level of the second amplifier so that the output of the second amplifier tracks any variations in the trip point signal of the second digital circuit.

9. The circuit of claim 6 wherein each of the first and second digital circuits includes a logic inverter.

10. The circuit of claim 6 wherein the first and second digital circuits have the same circuit layout.

11. The circuit of claim 6 wherein an input and an output of the second digital circuit are shorted to each other to yield a voltage being the trip point signal.

12. An apparatus comprising:
at least one differential-to-single-ended circuit each including a first differential amplifier having a pair of differential inputs, a pair of differential outputs, and a common mode output level adjustment input, and a first digital circuit having an input coupled to at least one of the differential outputs and an output that provides a single-ended digital signal;

digital circuitry clocked by the single ended digital signal;

second digital circuit that includes a replicate of a portion of the first circuit, to generate a trip point signal that is equivalent to a trip point level of the first digital circuit; and comparison amplifier having an output coupled to the common mode level adjustment input of the first differential amplifier to adjust the common mode output level of the first differential amplifier in response to the trip point signal of the second digital circuit.

13. The apparatus of claim 12 wherein the digital circuitry latches data on both a rising edge and a falling edge of the single ended digital signal.

14. The apparatus of claim 12 wherein the single ended digital signal has a 50% duty cycle.

15. The apparatus of claim 12 wherein the at least one differential-t-p-single-ended circuit, the digital circuitry, the second digital circuit, and the comparison amplifier are parts of the same integrated circuit die.

16. The apparatus of claim 12 wherein the at least one differential-to-single-ended circuit, the second digital circuit, and the comparison amplifier are parts of a first integrated circuit die, and wherein the digital circuitry is part of a second integrated circuit die.

17. The apparatus of claim 16 wherein the first and second dies are attached to the same printed wiring board.

18. The apparatus of claim 12 further comprising:

second differential amplifier that includes a replicate of a portion of the first differential amplifier, to generate a signal that is equivalent to a common mode output level of the first differential amplifier, the differential inputs of the second amplifier being shorted, the differential outputs of the second amplifier being shorted and coupled to an input of the comparison amplifier, and the output of the comparison amplifier being coupled to a common mode level adjustment input of the second amplifier.

\* \* \* \* \*

UNITED STATES PATENT AND TRADEMARK OFFICE
CERTIFICATE OF CORRECTION

PATENT NO. : 6,081,162  
DATED : June 27, 2000  
INVENTOR(S) : Johnson

Page 1 of 1

It is certified that error appears in the above-identified patent and that said Letters Patent is hereby corrected as shown below:

Column 7,
Line 23, delete "differential-t-p-single", insert -- differential-to-single --.

Signed and Sealed this

Twenty-first Day of May, 2002

Attest:

JAMES E. ROGAN
Director of the United States Patent and Trademark Office

Attesting Officer